United States Patent [19]

Yoshikawa et al.

[11] 4,309,604
[45] Jan. 5, 1982

[54] APPARATUS FOR SENSING THE WAVELENGTH AND INTENSITY OF LIGHT

[75] Inventors: Toshihumi Yoshikawa, Nara; Zempei Tani, Tondabayashi; Akira Aso, Nara; Hitoshi Kawanabe, Yamatokoriyama, all of Japan

[73] Assignee: Sharp Kabushiki Kaisha, Osaka, Japan

[21] Appl. No.: 60,189

[22] Filed: Jul. 24, 1979

[30] Foreign Application Priority Data

Jul. 24, 1978 [JP] Japan .................... 53-90665
Aug. 15, 1978 [JP] Japan .................... 53-99685
Sep. 20, 1978 [JP] Japan .................... 53-116211
Sep. 28, 1978 [JP] Japan .................... 53-120212
Sep. 28, 1978 [JP] Japan .................... 53-120213

[51] Int. Cl.³ .................... G01J 1/42; G01J 3/46; H01L 27/14
[52] U.S. Cl. .................... 250/226; 250/211 J; 356/222; 356/223; 356/402; 357/30
[58] Field of Search .................... 250/226, 211 J, 214 P; 357/30; 356/222, 223, 226, 230, 402, 419, 425, 435

[56] References Cited

U.S. PATENT DOCUMENTS

| 3,484,663 | 12/1969 | Halus | 250/211 J |
| 3,724,954 | 4/1973 | Dreyfoos, Jr. | 250/226 |
| 3,743,430 | 7/1973 | Riggs | 356/435 |
| 3,885,880 | 5/1975 | Tsunekawa et al. | 356/226 |
| 3,987,298 | 10/1976 | Rotolante | 250/211 J |
| 4,011,016 | 3/1977 | Layne et al. | 250/211 J X |

*Primary Examiner*—David C. Nelms
*Assistant Examiner*—Edward P. Westin
*Attorney, Agent, or Firm*—Birch, Stewart, Kolasch & Birch

[57] ABSTRACT

Disclosed is a solid state wavelength detection system responding to output signals derived from a photoelectric semiconductor device. The photoelectric semiconductor device comprise at least two PN junctions formed at different depth from the surface of the semiconductor substrate. A deeper PN junction develops an output signal related to longer wavelength component of the light impinging thereon. A shallower PN junction develops an output signal related to shorter wavelength component of the impinging light. These two output signals are logarithmically compressed and compared with each other. Difference of the logarithmically compressed output signals represents the wavelength information of the impinging light.

1 Claim, 12 Drawing Figures

APPARATUS FOR SENSING THE WAVELENGTH AND INTENSITY OF LIGHT

BACKGROUND AND SUMMARY OF THE INVENTION

The present invention relates to a color sensor including a photoelectric semiconductor device and, more particularly, to a wavelength detection system responding to output signals derived from a dual junction photoelectric semiconductor device including at least two PN junctions formed at different depth from the surface of the semiconductor device.

It is well known in the art that the photoelectric conversion phenomenon is observed when a light beam impinges on a semiconductor device including a PN junction. This photoelectric conversion phenomenon is utilized in various semiconductor devices such as photodiodes, phototransistors and solar batteries.

The light absorption factor is greatly influenced by the material of the semiconductor substrate and the wavelength of the light beam impinging thereon. A light beam of a shorter wavelength is absorbed near the surface of the semiconductor substrate, whereas a light beam of a longer wavelength reaches a deeper section of the substrate.

Therefore, when a photoelectric semiconductor device including at least two PN junctions formed at different depth from the surface of the semiconductor substrate is constructed, an output signal derived from a PN junction formed at a shallower section may represent the shorter wavelength component of the impinging light beam, and an output signal derived from a PN junction formed at a deeper section may represent the longer wavelength component of the impinging light beam.

Accordingly, an object of the present invention is to provide a wavelength detection system implemented with a photoelectric semiconductor device.

Another object of the present invention is to provide a solid state color sensor including a dual junction photoelectric semiconductor device having at least two PN junctions formed at different depths from the surface of the semiconductor substrate.

Still another object of the present invention is to provide a color difference measuring instrument responsive to output signals derived from a solid state wavelength detection system.

Yet another object of the present invention is to provide a light source output level control system including a solid state wavelength detection system.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a photoelectric semiconductor device is constructed to have at least two PN junctions formed at different depths from the surface of the semiconductor substrate. A first output signal derived from a deeper PN junction mainly represents the longer wavelength component of the light impinging on the photoelectric semiconductor device. A second output signal derived from a shallower PN junction mainly represents the shorter wavelength component of the impinging light.

In a preferred form, a first output signal is applied to a first logarithmic compression circuit, and a second output signal is applied to a second logarithmic compression circuit, respectively. Output signals of the first and second logarithmic compression circuits are applied to an operation amplifier to compare or substract the two output signals derived from the logarithmic compression circuits with each other. That is, the wavelength of the impinging light is detected by comparing the levels of the two output signals derived from the deeper PN junction and the shallower PN junction.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
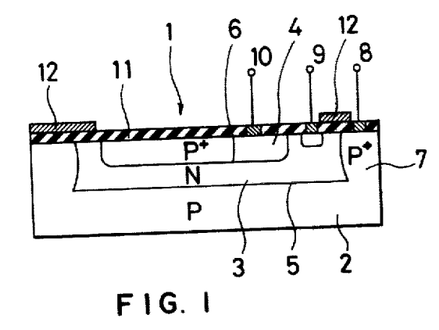
FIG. 1 is a sectional view of an embodiment of a photoelectric semiconductor device employed in a detection system of the present invention.

FIG. 1 shows an embodiment of a photoelectric semiconductor device employed in a detection system of the present invention.

A photoelectric semiconductor device 1 mainly comprises a P type silicon substrate 2, an N type epitaxial layer 3, and a P+ diffusion region 4 shallowly formed in the N type epitaxial layer 3. A first PN junction 5 is formed between the P type substrate 2 and the N type epitaxial layer 3. A second PN junction 6 is formed between the N type epitaxial layer 3 and the P+ diffusion region 4.

The photoelectric semiconductor device 1 further comprises a P+ isolation region 7, a first electrode 8 connected to the P type substrate 2, a second electrode 9 connected to the N type epitaxial region 3, and a third electrode 10 connected to the P+ diffusion region 4. A transparent insulator film 11, for example, an anti-halation film, is formed on the substrate 2 to cover at least the P+ region 4. An opaque thin film 12, for example, an aluminum film, is disposed on the transparent insulator film 11 at a position where the first PN junction 5 reaches the surface of the semiconductor substrate 2, thereby preventing the shorter wavelength component of the impinging light from being absorbed by the first PN junction 5 near the surface of the semiconductor substrate 2. The opaque thin film 12 functions to enhance the linear characteristic of the spectral sensitivity, and is preferably extended to a position adjacent to a section where the second PN junction 6 reaches the surface of the semiconductor substrate 2.

The photoelectric semiconductor device 1 is not limited to the PNP type. The NPN type structure can be employed.

Figure 2:
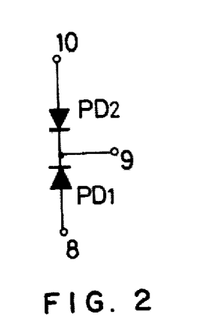
FIG. 2 is a circuit diagram of an equivalent circuit of the photoelectric semiconductor device of FIG. 1.

FIG. 2 shows an equivalent circuit of the photoelectric semiconductor device 1. The first PN junction 5 is represented as a first photodiode $PD_1$, and the second PN junction 6 is represented as a second photodiode $PD_2$.

Figure 3:
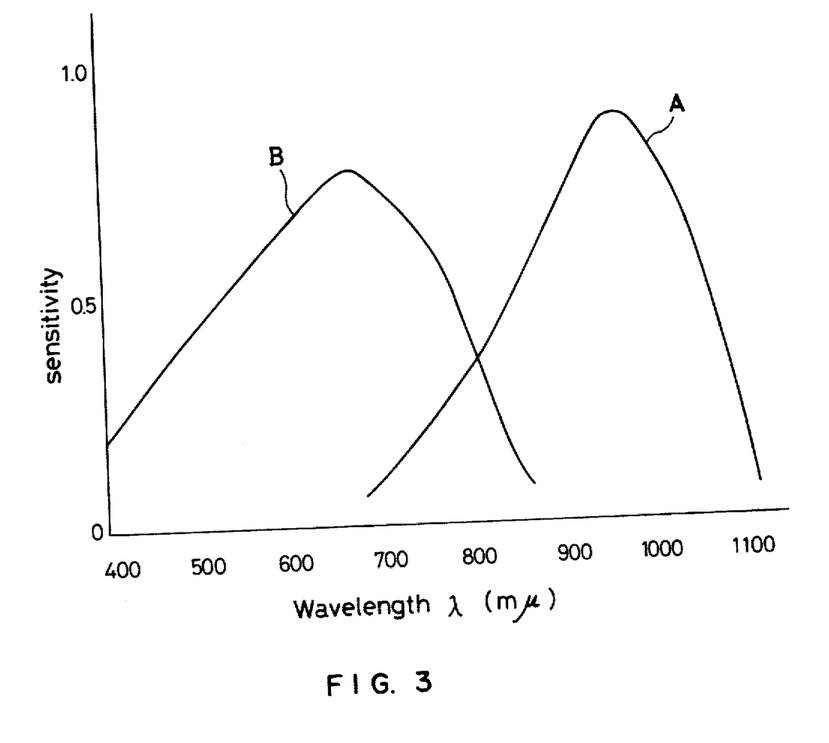
FIG. 3 is a graph showing a spectral sensitivity characteristic of the photoelectric semiconductor device of FIG. 1.

FIG. 3 shows the spectral sensitivity characteristic of the photoelectric semiconductor device 1.

A curve "A" represents the spectral sensitivity derived from the first photodiode $PD_1$ which has the deeper PN junction 5, and a curve "B" represents the spectral sensitivity derived from the second photodiode $PD_2$ which has the shallower PN junction 6. The first photodiode $PD_1$ absorbs the longer wavelength component of the impinging light, whereas the second photodiode $PD_2$ absorbs the shorter wavelength component of the impinging light.

Figure 4:
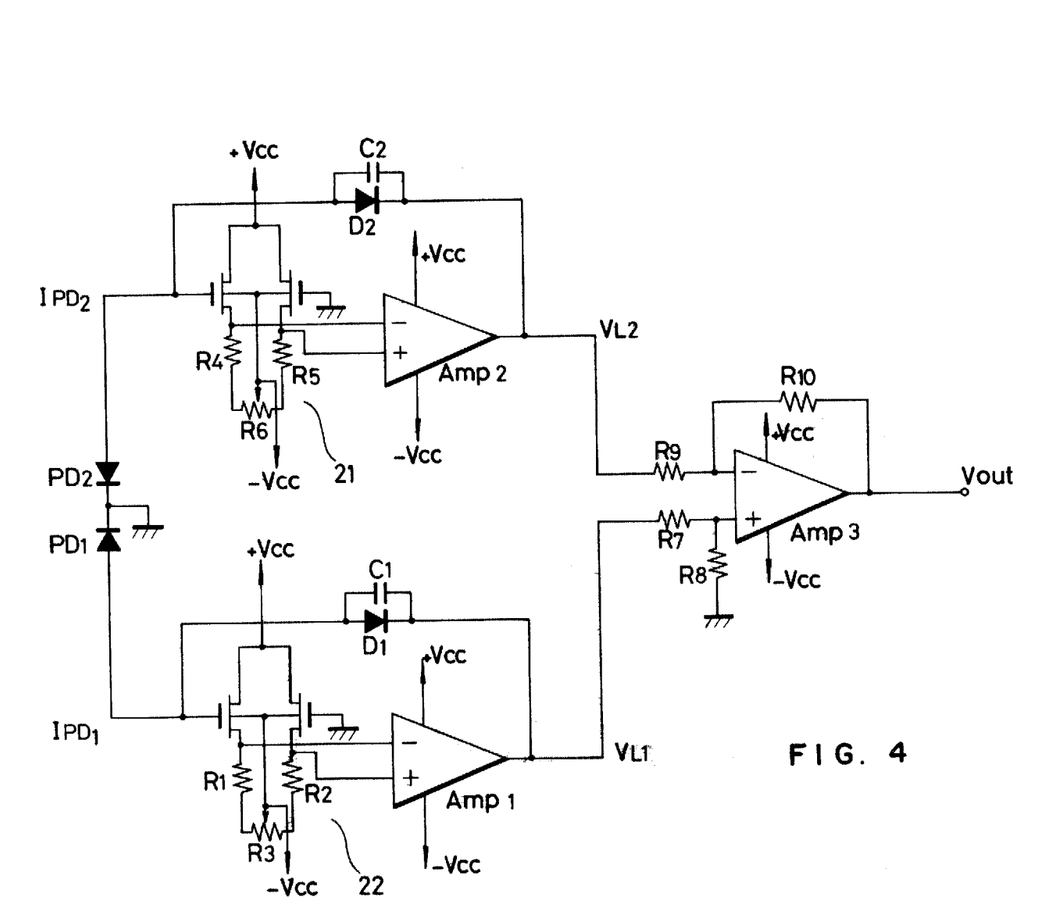
FIG. 4 is a circuit diagram of an embodiment of a detection system of the present invention.

FIG. 4 shows a wavelength detection circuit responding to output signals derived from the photoelectric semiconductor device 1.

An output current $I_{PD1}$ of the first photodiode $PD_1$ and an output current $I_{PD2}$ of the second photodiode $PD_2$ are applied to operation amplifier circuits 22 and 21, respectively. The operation amplifier circuits 21 and 22 show the high input impedance. The operation amplifier circuit 21 includes an operation amplifier $A_{mp2}$, and a Log diode $D_2$ disposed in the feedback loop of the operation amplifier $A_{mp2}$. The operation amplifier circuit 22 includes an operation amplifier $A_{mp1}$, and a Log diode $D_1$ disposed in the feedback roop of the operation amplifier $A_{mp1}$.

The Log diodes $D_1$ and $D_2$ show the logarithmic compression characteristic. More specifically, each Log diode shows the following relationship over the wide range.

$$I_F \propto \exp \frac{eV_F}{KT}$$

That is, the output currents $I_{PD1}$ and $I_{PD2}$ of the photodiodes $PD_1$ and $PD_2$ are logarithmically compressed.

An output signal $V_{L1}$ of the operation amplifier circuit 22 and an output signal $V_{L2}$ of the operation amplifier circuit 21 are applied to a ⊕ input terminal of an operation amplifier $A_{mp3}$ via a resistor $R_7$ and an ⊖ input terminal of the operation amplifier $A_{mp3}$ via a resistor $R_9$, respectively. The resistance values of the resistors $R_7$ and $R_9$ are selected at the same value. Additional resistors $R_8$ and $R_{10}$, which have the same resistance value, are connected to the operation amplifier $A_{mp3}$ so that the operation amplifier $A_{mp3}$ develops an output signal $V_{out}$ proportional to the difference between the output signals $V_{L1}$ and $V_{L2}$. More specifically, the output signal $V_{out}$ is proportional to the logarithmically compressed value (log $I_{PD2}/I_{PD1}$) of the ratio of the output currents $I_{PD1}$ and $I_{PD2}$ of the two photodiodes $PD_1$ and $PD_2$.

Figure 5:
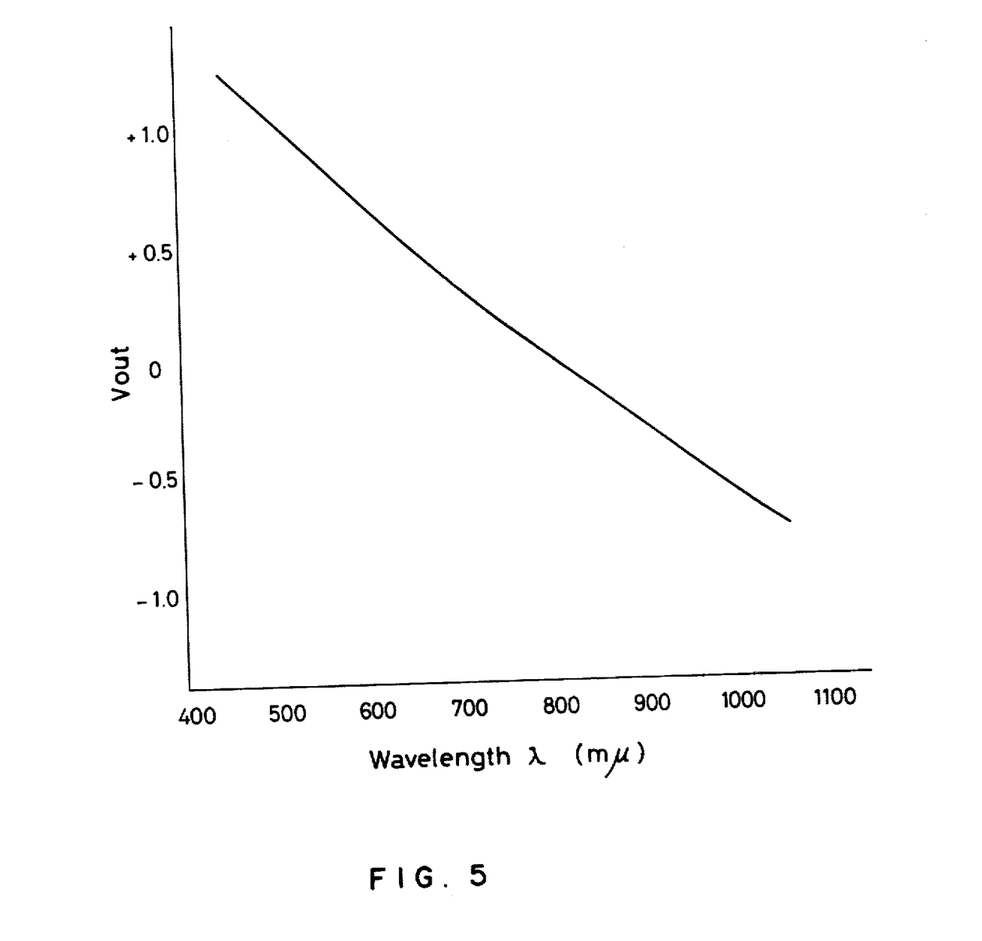
FIG. 5 is a graph showing an output voltage characteristic of the detection system of FIG. 4.

FIG. 5 shows the relationship between the output signal $V_{out}$ of the wavelength detection circuit of FIG. 4 and the wavelength of the light beam impinging on the photoelectric semiconductor device 1.

It will be clear from FIG. 5 that the output signal $V_{out}$ is corresponding to the wavelength of the impinging light beam. The output signal $V_{out}$ is not influenced by the intensity of the impinging light beam, because the wavelength detection circuit of FIG. 4 responds to the ratio of the output currents from the two photodiodes $PD_1$ and $PD_2$.

Figure 6:
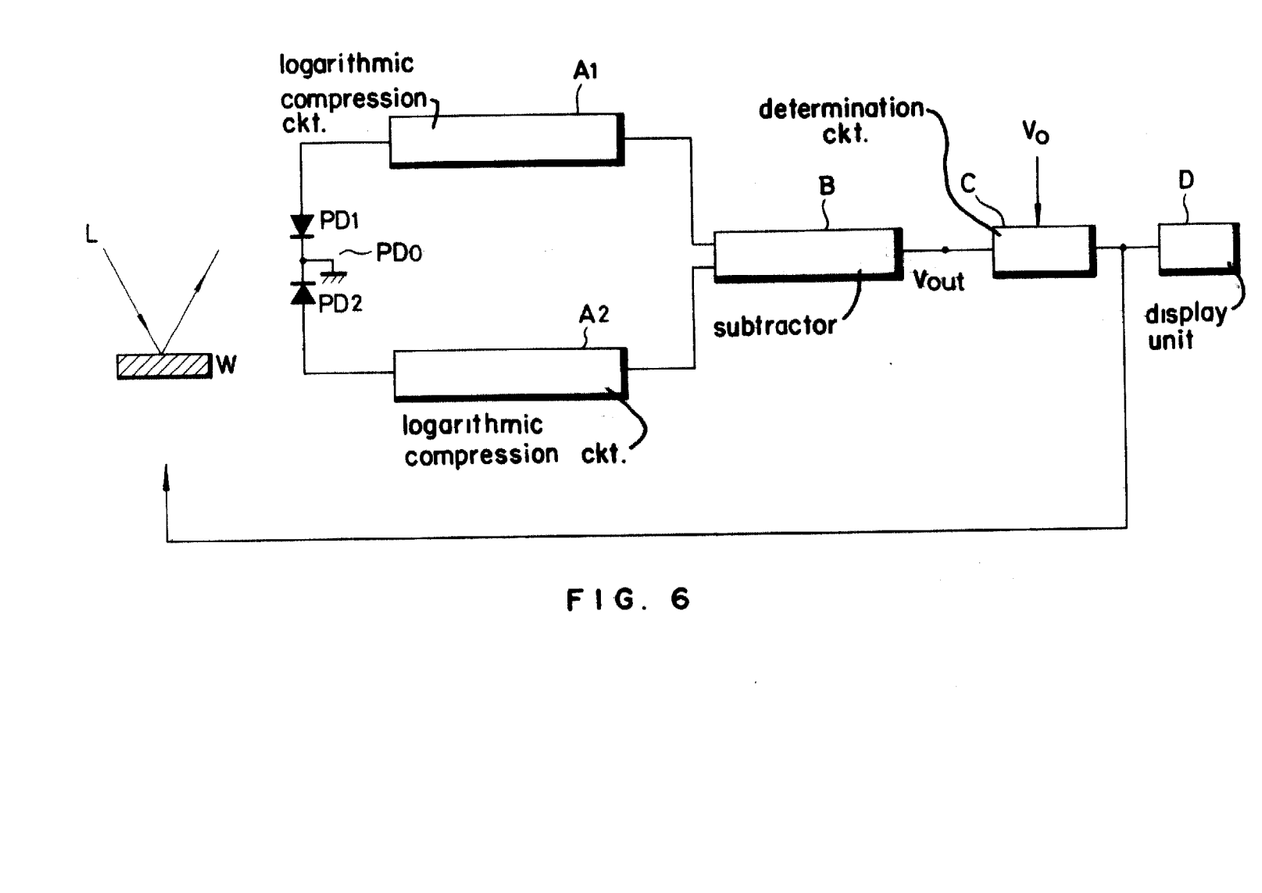
FIG. 6 is a block diagram of another embodiment of a detection system of the present invention.

FIG. 6 is a block diagram of a color difference detection system responding to output signals derived from the photoelectric semiconductor device 1.

A light beam emitted from a tungsten lamp "L" impinges on an object "W", and a reflected light is introduced into a photoelectric semiconductor device "$PD_0$". The photoelectric semiconductor device "$PD_0$" is the photoelectric semiconductor device 1 shown in FIG. 1. That is, the photoelectric semiconductor device "$PD_0$" comprises the first photodiode $PD_1$ and the second photodiode $PD_2$.

The output signal of the first photodiode $PD_1$ is applied to a logarithmic compression circuit "$A_1$", and the output signal of the second photodiode $PD_2$ is applied to another logarithmic compression circuit "$A_2$". Output signals of the logarithmic compression circuits "$A_1$" and "$A_2$" are applied to subtractor "B" which develops an output signal $V_{out}$ in response to the wavelength of the light beam applied to the photoelectric semiconductor device "$PD_0$". The logarithmic compression circuits "$A_1$" and "$A_2$", and subtractor "B" have the same construction as in the wavelength detection circuit of FIG. 4.

The output signal $V_{out}$ is applied to a determination circuit "C" which receives a reference level signal $V_0$. The reference level signal $V_0$ has a preselected level corresponding to a preselected color. The determination circuit C develops a determination signal (positive or negative) in response to the difference between the reference level signal $V_0$ and the output signal $V_{out}$ of the operation circuit "B". The determination signal is preferably applied to a display unit "D".

Figure 7:
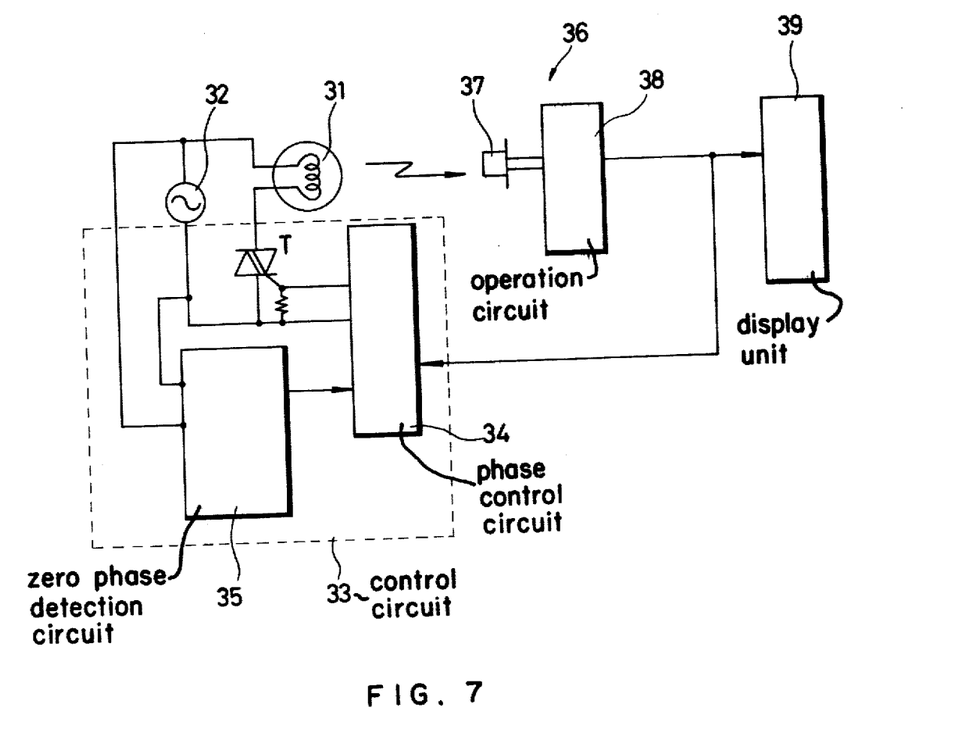
FIG. 7 is a block diagram of still another embodiment of a detection system of the present invention.

FIG. 7 is a block diagram of a light source output level control system responding to output signals derived from the photoelectric semiconductor device of FIG. 1.

An output level of the light source such as a tungsten lamp 31 connected to a commercial power supply source 32 is controlled by a control circuit 33 of which a construction is described later.

The light beam emitted from the tungsten lamp 31 is applied to a wavelength detection circuit 36. The wavelength detection circuit 36 comprises a photoelectric semiconductor device 37 having the construction as shown in FIG. 1, and an operation circuit 38 having the construction as shown in FIG. 4. That is, the operation circuit 38 develops an output signal in response to the wavelength of the light beam derived from the tungsten lamp 31 as shown in FIG. 5. The output signal of the operation circuit 38 (corresponding to the output signal $V_{out}$ of FIG. 4) is fed back to the control circuit 33. The output signal of the operation circuit 38 is preferably applied to a display unit 39.

The control circuit 33 comprises a TRIAC "T" connected to the tungsten lamp 31, a phase control circuit 34 and a zero phase detection circuit 35. The phase control circuit 34 functions to control the ON/OFF period of the TRIAC "T", thereby adjusting the power to be supplied to the tungsten lamp 31 from the commercial power supply source 32. The zero phase detection circuit 35 develops a zero phase detection signal of the commercial power supply source 32 to the phase control circuit 34 as a timing signal.

The output signal of the operation circuit 38, which represents the color temperature of the tungsten lamp 31, is applied to the phase control circuit 34, thereby maintaining the color temperature of the tungsten lamp 31 at a preselected level.

Figure 8:
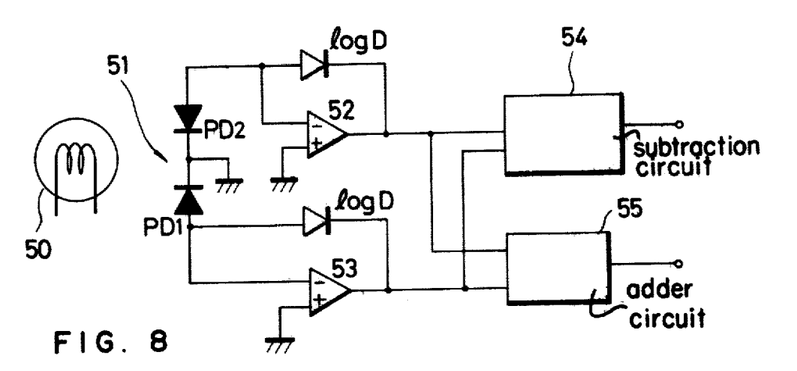
FIG. 8 is a block diagram of yet another embodiment of a detection system of the present invention.

FIG. 8 shows a detection system responding to output signals derived from the photoelectric semiconductor device of FIG. 1. The detection system of FIG. 8 functions to detect the wavelength and the intensity of the light impinging on the photoelectric semiconductor device.

A light beam emitted from a light source 50 is applied to a photoelectric semiconductor device 51 including a first photodiode PD$_1$ and a second photodiode PD$_2$. That is, the photoelectric semiconductor device 51 has the same construction as the photoelectric semiconductor device 1 of FIG. 1. The output signals of the first and second photodiodes PD$_1$ and PD$_2$ are applied to operation amplifiers 53 and 52, respectively. Logarithmic compression diodes "log D" are connected to the operation amplifiers 53 and 52 as shown in FIG. 4. Output signals of the operation amplifiers 53 and 52 are both applied to a subtraction circuit 54 and an adder circuit 55.

The subtraction circuit 54 develops an output signal proportional to (log I$_{PD2}$/I$_{PD1}$) as discussed with reference to FIGS. 4 and 5. The adder circuit 55 develops an output signal proportional to (log I$_{PD1}$·I$_{PD2}$). That is, the output signal of the subtraction circuit 54 represents the wavelength of the light applied to the photoelectric semiconductor device 51. The output signal of the adder circuit 55 represents the intensity of the light applied to the photoelectric semiconductor device 51.

Figure 9:
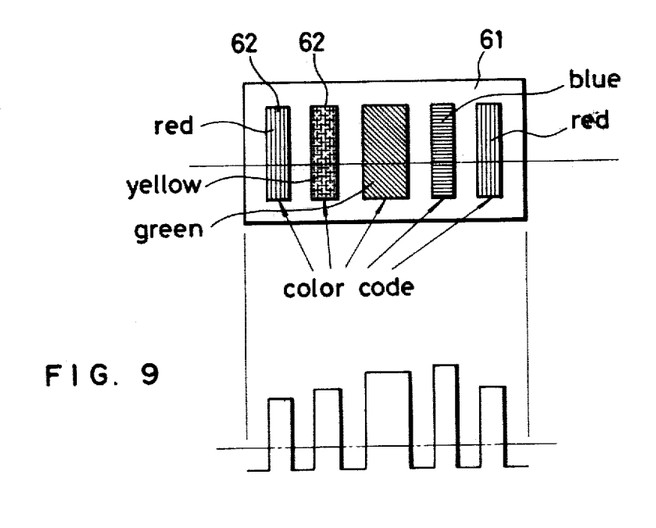
FIG. 9 is a chart for explaining an operation mode of the detection system of FIG. 8.

The detection system of FIG. 8 can be applied to a color bar-code reader. When the detection system of FIG. 8 scans a color bar code 62 marked on a black background 61, output signals are developed in response to the color of the bar code as shown in FIG. 9. To ensure an accurate detection, it is preferable that the wavelength detection is reset when the intensity output is below a predetermined value.

Figure 10:
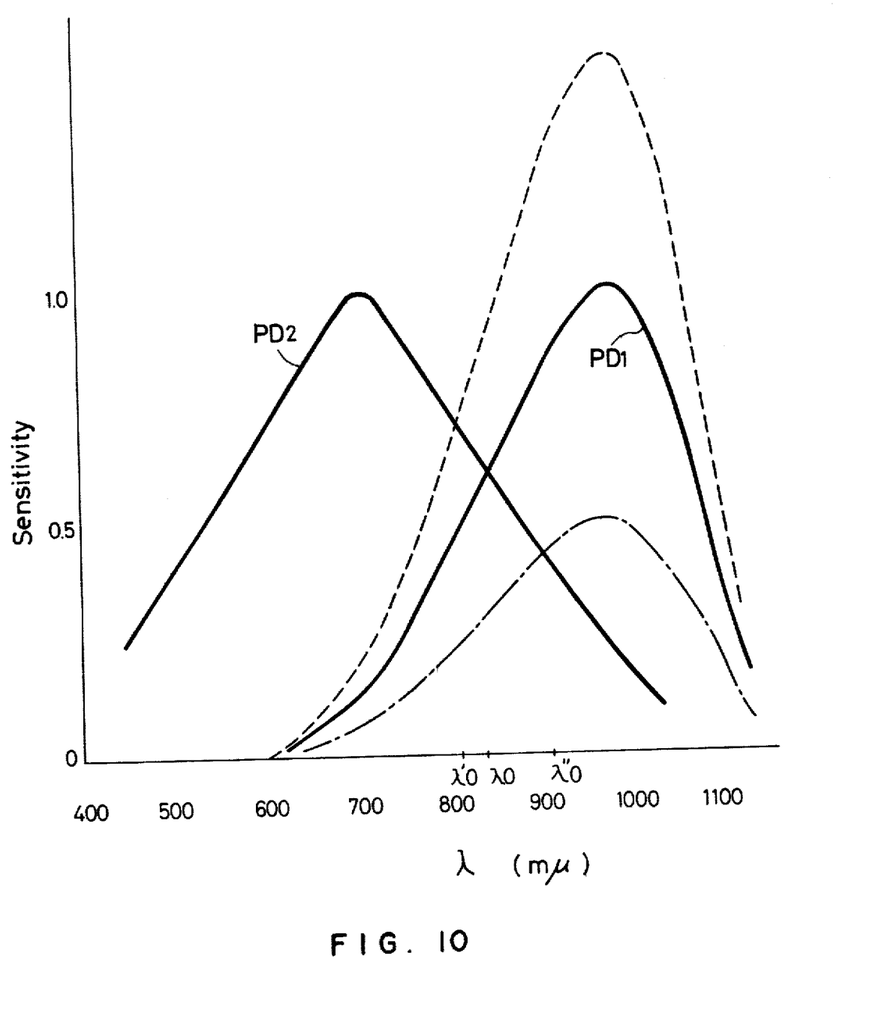
FIG. 10 is a graph showing a spectral sensitivity characteristic of the photoelectric semiconductor device of FIG. 1.

FIG. 10 shows the spectral sensitivity of the photoelectric semiconductor device of FIG. 1. When the first and second photodiodes PD$_1$ and PD$_2$ have the same peak level, the output signals of the two photodiodes PD$_1$ and PD$_2$ have the same level at the wavelength $\lambda_0$. If the impinging light beam has the wavelength longer than "$\lambda_0$", the first photodiode PD$_1$ exhibits the higher sensitivity than the second photodiode PD$_2$. Contrarily, when the impinging light beam has the wavelength shorter than "$\lambda_0$", the first photodiode PD$_1$ exhibits the lower sensitivity than the second photodiode PD$_2$.

Figures 11, 12:
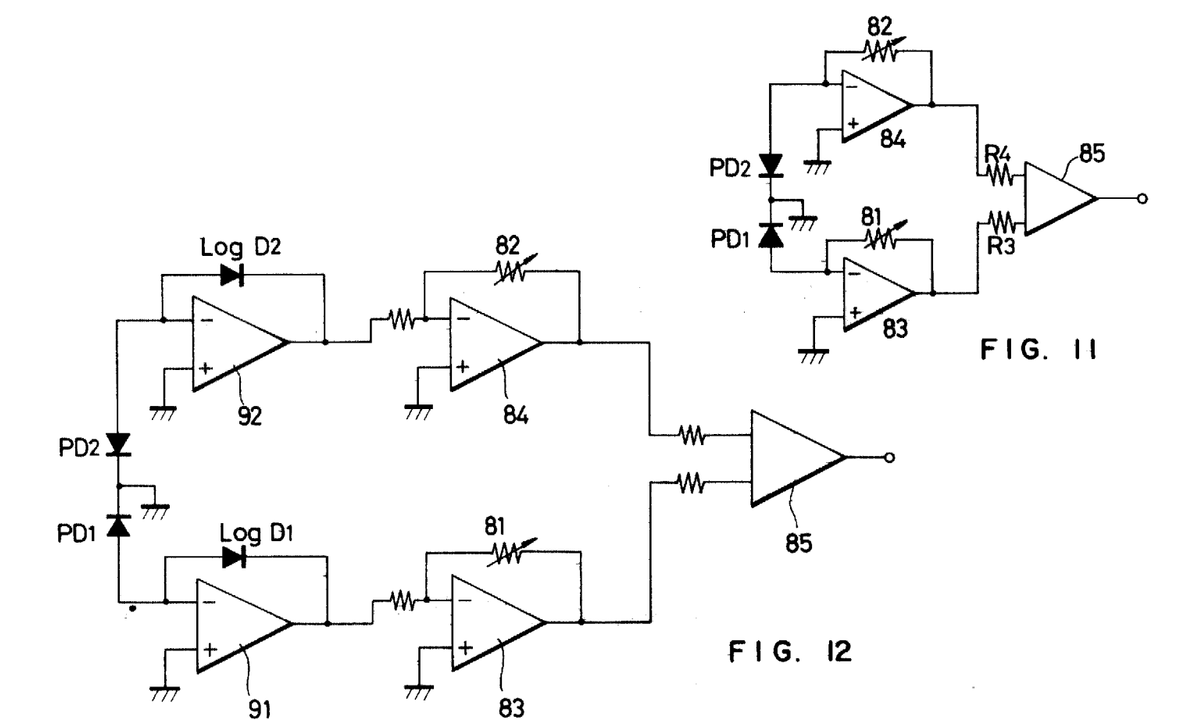
FIG. 11 is a circuit diagram of a further embodiment of a detection system of the present invention.
FIG. 12 is a circuit diagram of a still further embodiment of a detection system of the present invention.

FIG. 11 shows the color difference detection system utilizing the above-mentioned phenomenon.

The output signals of the first and second photodiodes PD$_1$ and PD$_2$ are applied to amplifiers 83 and 84, respectively. Variable resistors 81 and 82 are connected to the amplifiers 83 and 84, respectively, for varying the amplification factors. That is, output signals of the amplifiers 83 and 84 are preset at a preferred relationship.

For example, the amplification factors are set at a same value so that the two output signals of the amplifiers 83 and 84 take the same level at the wavelength $\lambda_0$ as shown in FIG. 10. When the amplifier 83 has the amplification factor of 1.5 times that of the amplifier 84, the two output signals of the amplifiers 83 and 84 take the same level at the wavelength $\lambda'_0$ as shown in FIG. 10. If the amplifier 83 has the amplification factor of 0.5 times that of the amplifier 84, the two output signals of the amplifiers 83 and 84 take the same level at the wavelength $\lambda''_0$ as shown in FIG. 10.

The two output signals derived from the amplifiers 83 and 84 are applied to a comparactor 85 via resistors R$_3$ and R$_4$, respectively.

FIG. 12 shows a modification of the color difference detection system of FIG. 11.

The output signals of the first and second photodiodes PD$_1$ and PD$_2$ are applied to the amplifiers 83 and 84 through operation amplifiers 91 and 92, respectively. Logarithmic compression diodes log D$_1$ and log D$_2$ are connected to the operation amplifiers 91 and 92, respectively.

Operation modes of the color difference detection systems of FIGS. 11 and 12 are similar to that of the color difference detection system of FIG. 6.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An optoelectric detection system comprising: a photoelectric semiconductor device including;
   a semiconductor substrate;
   at least two PN junctions formed in said semiconductor substrate at different depths from the surface of said semiconductor substrate;
   first output electrode means for developing first output signals derived from the deeper of said at least two PN junctions; and
   second output electrode means for developing second output signals derived from the shallower of said at least two PN junctions;
   a first logarithmic compression circuit for logarithmically compressing said first output signals;
   a second logarithmic compression circuit for logarithmically compressing said second output signals;
   a subtractor connected to receive output signals derived from said first logarithmic compression circuit and said second logarithmic compression circuit, respectively, and
   an adder connected to receive outputs from said first and second logarithmic compression circuits;
   said subtractor developing a third output signal related to the wavelength of light impinging on said photoelectric semiconductor device;
   said adder developing a fourth output signal related to the intensity of light impinging on said photoelectric semiconductor device;
   said first PN junction being sensitive to light of a first particular wavelength band;

said second PN junction being sensitive to light of a second predetermined wavelength band including wavelengths greater than those in said first particular wavelength band;
said first PN junction and said second PN junction have substantially equivalent sensitivities to light intensity.

* * * * *